(12) United States Patent
Gregorian et al.

(10) Patent No.: US 6,798,857 B2
(45) Date of Patent: Sep. 28, 2004

(54) CLOCK RECOVERY CIRCUIT

(75) Inventors: Roubik Gregorian, Saratoga, CA (US); Shih-Chung Fan, Fremont, CA (US)

(73) Assignee: Exar Corporation, Fremont, CA (US)

( * ) Notice: Subject to any disclaimer, the term of this patent is extended or adjusted under 35 U.S.C. 154(b) by 659 days.

(21) Appl. No.: 09/728,295

(22) Filed: Dec. 1, 2000

(65) Prior Publication Data

US 2002/0067788 A1 Jun. 6, 2002

(51) Int. Cl.[7] .............................. H04L 7/02; H03D 3/24
(52) U.S. Cl. ...................... 375/360; 375/373; 375/376
(58) Field of Search ..................... 375/360, 371, 375/373, 376, 333; 327/24, 147, 150, 151, 156, 159, 160; 713/400, 500, 502, 503

(56) References Cited

U.S. PATENT DOCUMENTS

| | | | | |
|---|---|---|---|---|
| 4,584,695 A | * | 4/1986 | Wong et al. | 375/327 |
| 5,012,198 A | * | 4/1991 | Okada et al. | 327/152 |
| 5,040,193 A | * | 8/1991 | Leonowich et al. | 375/333 |
| 5,463,351 A | * | 10/1995 | Marko et al. | 331/1 A |
| 5,598,448 A | * | 1/1997 | Girardeau, Jr. | 375/376 |
| 5,754,606 A | * | 5/1998 | Matsuyama et al. | 375/373 |
| 6,064,236 A | * | 5/2000 | Kuwata et al. | 327/12 |
| 6,584,163 B1 | * | 6/2003 | Myers et al. | 375/360 |

* cited by examiner

*Primary Examiner*—Betsy L. Deppe
(74) *Attorney, Agent, or Firm*—Townsend and Townsend and Crew LLP

(57) ABSTRACT

A clock recovery circuit which has a transition detector connected to the incoming data stream. An output of the transition detector is connected to a gate, such as a D flip-flop, which has an input receiving the recovered clock. A zero or one output will be generated depending upon whether the transition is before or after the rising edge of the recovered clock. An accumulator circuit accumulates a count for each transition, providing the results to a comparison circuit. The comparison circuit compares the accumulated count to maximum and minimum thresholds, and provides advance or retard outputs when those thresholds are exceeded. A phase circuit adjusts the phase of the recovered clock by advancing or retarding it after a sufficient number of transitions have been detected either in advance or behind the recovered clock to justify such an adjustment.

14 Claims, 2 Drawing Sheets

CLOCK RECOVERY CIRCUIT

BACKGROUND OF THE INVENTION

The present invention relates to clock recovery circuits, in particular circuits for recovering a clock from serial digital data.

Serial data is sent on a number of transmission mediums without a separate clock signal for clocking the data and determining when one period ends and the next begins. This requires that the receiver circuitry be able to recover the clock from the data itself. Examples of clock recovery circuits can be found in U.S. Pat. Nos. 6,035,409; 6,100,765; and 6,101,230.

One of the issues involved in clock recovery is maintaining the clock phase aligned with incoming data. This can be particularly problematic where there are stretches of data without a transition in the data for the clock recovery circuit to key on. It would be desirable to provide a clock recovery circuit which provides the above functions, can be implemented without much circuitry, and can be implemented in digital circuitry.

SUMMARY OF THE INVENTION

The present invention provides a clock recovery circuit which has a transition detector connected to the incoming data stream. An output of the transition detector is connected to a gate, such as a D flip-flop, which has an input receiving the recovered clock. A zero or one output will be generated depending upon whether the transition is before or after the rising edge of the recovered clock. An accumulator circuit accumulates a count for each transition, providing the results to a comparison circuit. The comparison circuit compares the accumulated count to maximum and minimum thresholds, and provides advance or retard outputs when those thresholds are exceeded. A phase circuit adjusts the phase of the recovered clock by advancing or retarding it after a sufficient number of transitions have been detected either in advance or behind the recovered clock to justify such an adjustment.

The invention can be implemented in simple digital circuitry, and can use an accumulator circuit which need only store six or fewer bits. With four bits, a value of +/−7 can be stored, which is sufficient for most purposes.

In one embodiment the accumulator is clocked by the transition as well, insuring that only transitions accumulate in the accumulator. The flip-flop output is preferably connected to the select input of a multiplexer, with the inputs being either positive or negative 1. Thus, either a positive or negative 1 will be provided to the accumulator, to accumulate up or down upon that corresponding transition. Advance and retard outputs of the comparison circuit are connected through an OR gate back to a reset input of the accumulator.

The present invention provides a clock recovery circuit that works in periods of no data. It also provides a circuit that is simple, can be implemented with digital circuitry, and does not require much chip space, and only uses a small accumulator.

For a further understanding of the nature and advantages of the invention, reference should be made to the following description taken in conjunction with the accompanying drawings.

DESCRIPTION OF THE SPECIFIC EMBODIMENTS

Figure 1:
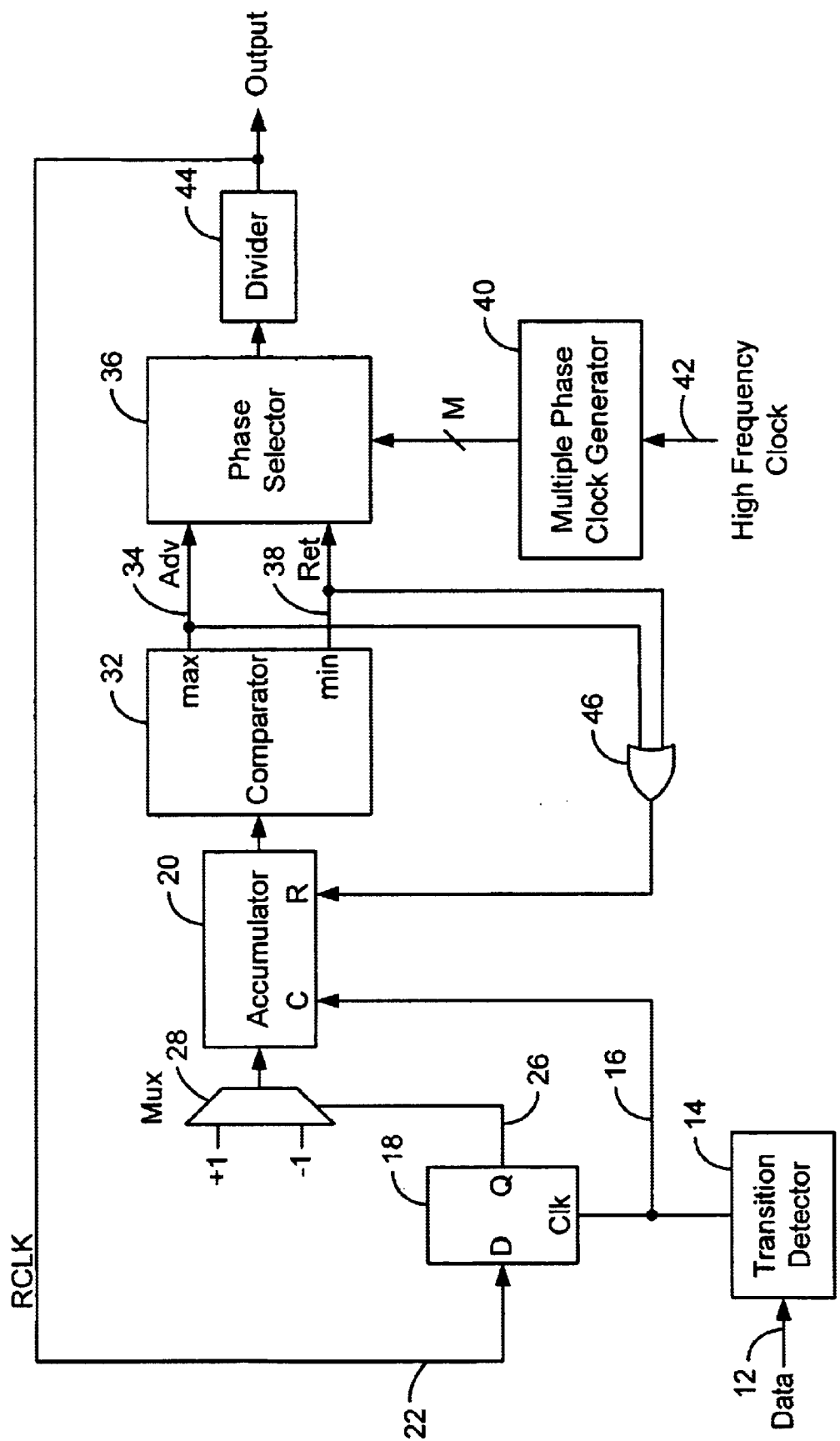
FIG. 1 is a block diagram of one embodiment of the invention.

FIG. 1 shows input serial data on a line 12 being provided to a transition detector 14. An output of the transition detector is provided on line 16 to a clock input of a D flip-flop 18, and also to the clock input of an accumulator 20. The input of D flip-flop 18 is the recovered clock, RCLK, on line 22.

Figure 2:
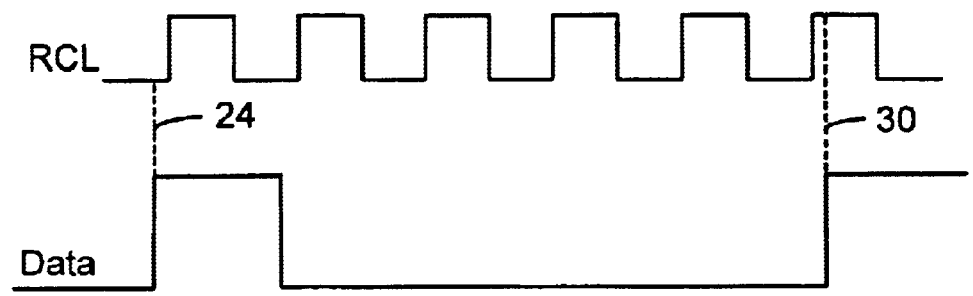
FIG. 2 is a timing diagram illustrating data transitions with respect to the recovered clock.

Referring to FIG. 2, at a first point in time 24, the rising edge of the data signal is before the rising edge of the recovered clock signal. Accordingly, the recovered clock will be zero at this point, and a zero value will be provided at the output 26 of D flip-flop 18. This zero output 26 will select a positive 1 input to multiplexer 28, which will then be provided to accumulator 20. This positive 1 indicates that the receive clock needs to be advanced slightly to put it back into alignment with the data.

If on the other hand, as shown by a point in time 30, the rising edge of the data is after the rising edge of the recovered clock, a value of 1 will be provided to output 26 of D flip-flop 18. This will in turn select the negative 1 input of multiplexer 28, indicating that the phase of the recovered clock, RCLK, needs to be retarded to align it with the data.

Accumulator 20 provides its output to a comparator 32. Comparator 32 is programmed with maximum and minimum thresholds which are compared to the accumulator output. Typically, the maximum and minimum thresholds will require several bits before the threshold is exceeded, to avoid constantly changing the clock on minimal phase differences. In one embodiment, the accumulator can do this with less than six bits of resolution. In one embodiment, only four bits are needed, providing a sign bit and three bits to provide +/−7 bits of resolution.

If the output of accumulator 20 exceeds the maximum threshold, the comparator will provide an advance output on line 34 to a phase selector 36. If instead the accumulator value is negative and falls below the minimum threshold, a retard signal will be provided on output line 38 to phase selector 36. The phase selector will select one of multiple phases provided through a multiple phase clock generator 40 from a high frequency clock on a line 42. A divider 44 connected to the output of phase selector 36 divides down the high frequency clock to the frequency corresponding to the data input. The output of divider 44 is the recovered clock, RCLK, on line 22.

When an advance or retard output of comparator 32 is generated, these lines are also coupled through an OR gate 46 to a reset input of accumulator 20. Either the advance signal on line 34 or the retard signal on line 38 will reset the accumulator.

Figure 3:
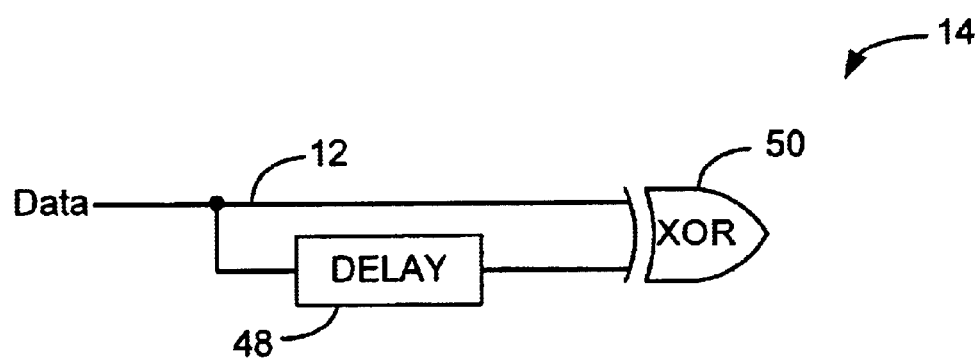
FIG. 3 is a block diagram of one embodiment of the transition detector of FIG.

FIG. 3 illustrates one embodiment of a transition detector 14 of FIG. 1. The data on line 12 is simply provided through a delay circuit 48, and then combined with the non-delayed data through an exclusive OR gate 50. When there has been no transition, and thus is a steady state high value or low value, no output will be generated. However, at the point in time of a transition, the delayed signal will be high and the regular signal low, or vice versa, causing an output of one to be generated by the exclusive OR gate 50.

FIG. 2 shows the invention being used on non-return to zero (NRZ) data. However, the application can be applied to any type of serial digital data.

The present invention provides a clock recovery circuit that works in periods of no data. It also provides a circuit that is simple, can be implemented with digital circuitry, and does not require much chip space, and only uses a small accumulator.

As will be understood by those of skill in the art, the present invention may be embodied in other specific forms without departing from the essential characteristics thereof. For example, any integrator or other accumulation circuit could be used rather than accumulator 20 illustrated. Other circuitry could be used to generate the multiple phases rather than selecting between multiple high speed phase clocks as shown in the embodiment of FIG. 1. Other types of gates could be used than a D flip-flop and other logic could replace the multiplexer while providing the essential function of providing incrementing or decrementing value to the accumulator. For example, an up/down counter or other circuit could be used to accumulate the results. Accordingly, the foregoing description is intended to be illustrative, but not limiting, of the scope of the invention which is set forth in the following claims.

What is claimed is:

1. A clock recovery circuit comprising:

a transition detector having an input coupled to a data stream;

a gate having a recovered clock as an input and a clock input coupled to an output of said transition detector;

an accumulator circuit, coupled to an output of said gate, for accumulating in positive and negative directions based upon each output of said gate, wherein said accumulator circuit comprises a multiplexing circuit having a select input coupled to the output of said gate, a first input connected to a negative one input and a second input connected to a positive one input, and an accumulator having an input coupled to an output of said multiplexing circuit, and a clock input coupled to said output of said transition detector;

a comparison circuit for comparing an output of said accumulator circuit to maximum and minimum thresholds; and a phase circuit, having an input coupled to an output of said comparison circuit, for changing a phase of said recovered clock in advance and retard directions responsive to advance and retard signal outputs of said comparison circuit.

2. The circuit of claim 1 further comprising:

a multiple phase clock generator; and said phase circuit being a phase selector for selecting one of multiple outputs of said multiple phase clock generator.

3. The circuit of claim 1 further comprising:

OR logic having inputs coupled to the advance and retard outputs of said comparison circuit, an output of said OR logic being connected to a reset input of said accumulator.

4. The circuit of claim 1 further comprising:

a divider coupled to an output of said phase circuit, an output of said divider providing said recovered clock.

5. The circuit of claim 1 where said accumulator circuit comprises a less than 5-bit accumulator.

6. The circuit of claim 5 wherein said accumulator is a 3-bit accumulator.

7. The circuit of claim 1 wherein said gate is a D flip-flop.

8. A clock recovery circuit comprising:

a transition detector having an input coupled to a data stream;

a gate having a recovered clock as an input and a clock input coupled to an output of said transition detector;

a multiplexing circuit having a select input coupled to an output of said gate, a first input connected to a negative one input and a second input connected to a positive one input;

an accumulator having an input coupled to an output of said multiplexing circuit, and a clock input coupled to said output of said transition detector, for accumulating in positive and negative directions based upon each output of said multiplexer;

a comparison circuit for comparing an output of said accumulator circuit to maximum and minimum thresholds;

a multiple phase clock generator; and a phase selector circuit, having an input coupled to an output of said comparison circuit, for selecting one of multiple outputs of said multiple phase clock generator responsive to advance and retard output signals of said comparison circuit.

9. The circuit of claim 8 further comprising:

OR logic having inputs coupled to receive the advance and retard output signals of said comparison circuit, an output of said OR logic being connected to a reset input of said accumulator.

10. The circuit of claim 8 further comprising:

a divider coupled to an output of said phase circuit, an output of said divider providing said recovered clock.

11. The circuit of claim 8 where said accumulator comprises a less than 5-bit accumulator.

12. The circuit of claim 8 wherein said accumulator is a 3-bit accumulator.

13. The circuit of claim 8 wherein said gate is a D flip-flop.

14. A clock recovery circuit comprising:

a transition detector having an input coupled to a data stream;

a D flip-flop gate having a recovered clock as an input and a clock input coupled to an output of said transition detector;

a multiplexing circuit having a select input coupled to an output of said gate, a first input connected to a negative one input and a second input connected to a positive one input;

a 5-bit or less accumulator having an input coupled to an output of said multiplexing circuit, and a clock input coupled to said output of said transition detector, for accumulating in positive and negative directions based upon each output of said multiplexer;

a comparison circuit for comparing an output of said accumulator circuit to maximum and minimum thresholds;

a multiple phase clock generator;

a phase selector circuit, having inputs coupled to outputs of said comparison circuit, for selecting one of multiple outputs of said multiple phase clock generator responsive to advance and retard outputs of said comparison circuit;

OR logic having inputs coupled to the advance and retard outputs of said comparison circuit, an output of said OR logic being connected to a reset input of said accumulator; and a divider coupled to an output of said phase circuit, an output of said divider providing said recovered clock.

* * * * *